United States Patent
Schultz et al.

(10) Patent No.: US 7,424,690 B2
(45) Date of Patent: Sep. 9, 2008

(54) INTERCONNECT INTEGRITY VERIFICATION

(75) Inventors: Richard T Schultz, Fort Collins, CO (US); Robert Waldron, Fort Collins, CO (US); Norman Mause, Fort Collins, CO (US); Larry Greenhouse, San Diego, CA (US)

(73) Assignee: LSI Corporation, Milpitas, CA (US)

( * ) Notice: Subject to any disclaimer, the term of this patent is extended or adjusted under 35 U.S.C. 154(b) by 494 days.

(21) Appl. No.: 11/005,690

(22) Filed: Dec. 7, 2004

(65) Prior Publication Data

US 2006/0123377 A1      Jun. 8, 2006

(51) Int. Cl.
*G06F 17/50*   (2006.01)

(52) U.S. Cl. .............. 716/5; 716/4; 716/10; 716/11

(58) Field of Classification Search ............. 716/1–2, 716/4–5, 10–15, 18; 703/13–15
See application file for complete search history.

(56) References Cited

U.S. PATENT DOCUMENTS

| | | | | |
|---|---|---|---|---|
| 5,901,066 A | * | 5/1999 | Hong | 716/8 |
| 5,943,487 A | * | 8/1999 | Messerman et al. | 716/11 |
| 6,298,469 B1 | * | 10/2001 | Yin | 716/3 |
| 2003/0069722 A1 | * | 4/2003 | Beattie et al. | 703/14 |

* cited by examiner

*Primary Examiner*—Paul Dinh
(74) *Attorney, Agent, or Firm*—Krajec Patent Offices, LLC (57) ABSTRACT

A system and method for designing a complex electronic circuit by simulating blocks of the circuit using various simulators to produce a net list, designing the physical layout of the circuit using a layout tool that produces a layout verses schematic reference file, mapping the reference file to the net list to create a mapping file, and analyzing the mapping file to verify that the layout meets various criteria. Each block may be verified using simulation tools that are appropriate for that piece of the overall circuit, and using conditions that may maximize the strain on the circuit. The results from the simulations are compared to the physical layout to determine if the physical layout is able to properly conduct the electrical signals.

22 Claims, 5 Drawing Sheets

INTERCONNECT INTEGRITY VERIFICATION

BACKGROUND OF THE INVENTION a. Field of the Invention

The present invention pertains generally to electronic circuit design tools and specifically to tools capable of checking physical layout parameters against simulated performance results.

b. Description of the Background

Complex electronic circuits, such as those found in today's very large scale integrated (VLSI) chips, require many steps to bring a design into production. Several designers may create circuits to perform various functions, and different people may layout the circuits into metal traces and devices to implement the circuits.

Various tools are used by different disciplines during the development of a complex circuit. Several different circuit simulators are used by the circuit designers to hone and optimize the circuits. Some simulators may be used for analog circuits while others may be suited for digital circuits. Typically, a simulator may create a net list, which defines the circuit and which may include various operating parameters for the circuit, such as current and voltage of a signal on each node or connection throughout the circuit.

A layout designer may take the net list produced by the simulator and create a physical embodiment of the circuit. This may include placing devices in a semiconductor substrate and connecting those devices using various traces within an integrated circuit. When the layout designer has finished the physical layout, a tool may be used to compare the actual physical layout to the net list, making sure that all connections are consistent with the circuit design.

When the circuit has been completed, some simulators exist that can simulate the performance of the entire circuit en mass and when the entire layout is complete. Such simulators may not be optimized for specific circuits. Additionally, such simulators are often extremely complex and require extraordinary amounts of processor power to operate, even when simulating using mere approximations.

It would therefore be advantageous to provide a system and method whereby a complex circuit may be designed and developed using accurate simulations and that did not require a complex and time-consuming simulation after the layout is complete.

SUMMARY OF THE INVENTION

The present invention overcomes the disadvantages and limitations of previous solutions by providing a system and method for designing a complex electronic circuit by simulating blocks of the circuit using various simulators to produce an output file, designing the physical layout of the circuit using a layout tool that produces a layout verses schematic reference file, mapping the reference file to the simulator output file to create a mapping file, and analyzing the mapping file to verify that the layout meets various criteria.

A very large circuit may be designed in many blocks, which may be simulated using various simulation tools. The results of these simulations are mapped onto the physical representation of the circuit and analyzed. The analysis performed on the circuit block may be used to make necessary changes to the physical circuit layout before the blocks of circuits are joined together in the design. Each block may be verified using simulation tools that are appropriate for that piece of the overall circuit, and using conditions that may maximize the strain on the circuit. The results from the simulations are compared to the physical layout to determine if the physical layout is able to properly conduct the electrical signals.

One embodiment of the present invention may include a system comprising: a system comprising: a schematic simulation tool capable of simulating a portion of a circuit and generating a simulator output file comprising at least one circuit performance value for at least one connection in the simulator output file; a layout tool capable of generating a physical representation of the portion of a circuit and further capable of generating a reference file comprising physical layout information for at least one element of the one connection; a mapping tool capable of generating a mapping file comprising the at least one circuit performance value with the physical layout information for the at least one element; and an analysis tool capable of evaluating the mapping file to determine that the physical layout information is sufficient based upon the at least one circuit performance value for the at least one element.

Another embodiment of the present invention may include a method comprising: generating a schematic output file using a schematic simulation tool, the schematic output file comprising at least one circuit performance value for at least one connection of a circuit; generating a physical layout for the circuit, the physical layout comprising at least one physical element describing the at least one connection; generating a reference file containing physical layout information for the at least one element; generating a mapping file comprising the physical layout information and the at least one circuit performance value for the at least one element; and evaluating the mapping file by comparing the at least one circuit performance value with the physical layout information with predetermined rules for the element.

The advantages of the present invention are that very large and complex circuits may be built and verified in stages, with each stage being fully simulated and laid out. These blocks may be connected together to create a very large circuit without the risk of having to make significant changes to the circuit at a later time. The detailed and accurate simulation results used to design a block of circuitry are used to verify the layout, rather than relying on approximate simulations.

DETAILED DESCRIPTION OF THE INVENTION

Specific embodiments of the invention are described in detail below. The embodiments were selected to illustrate various features of the invention, but should not be considered to limit the invention to the embodiments described, as the invention is susceptible to various modifications and alternative forms. The invention is to cover all modifications, equivalents, and alternatives falling within the spirit and scope of the invention as defined by the claims. In general, the embodiments were selected to highlight specific inventive aspects or features of the invention.

Throughout this specification, like reference numbers signify the same elements throughout the description of the figures.

When elements are referred to as being "connected" or "coupled," the elements can be directly connected or coupled together or one or more intervening elements may also be present. In contrast, when elements are referred to as being "directly connected" or "directly coupled," there are no intervening elements present.

The invention may be embodied as devices, systems, methods, and/or computer program products. Accordingly, some or all of the invention may be embodied in hardware and/or in software (including firmware, resident software, micro-code, state machines, gate arrays, etc.) Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. By way of example, and not limitation, computer readable media may comprise computer storage media and communication media.

Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can accessed by an instruction execution system. Note that the computer-usable or computer-readable medium could be paper or another suitable medium upon which the program is printed, as the program can be electronically captured, via, for instance, optical scanning of the paper or other medium, then compiled, interpreted, of otherwise processed in a suitable manner, if necessary, and then stored in a computer memory.

Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

When the invention is embodied in the general context of computer-executable instructions, the embodiment may comprise program modules, executed by one or more systems, computers, or other devices. Generally, program modules include routines, programs, objects, components, data structures, etc. that perform particular tasks or implement particular abstract data types. Typically, the functionality of the program modules may be combined or distributed as desired in various embodiments.

Throughout this specification, the term "comprising" shall be synonymous with "including," "containing," or "characterized by," is inclusive or open-ended and does not exclude additional, unrecited elements or method steps. "Comprising" is a term of art which means that the named elements are essential, but other elements may be added and still form a construct within the scope of the statement. "Comprising" leaves open for the inclusion of unspecified ingredients even in major amounts.

Figure 1:
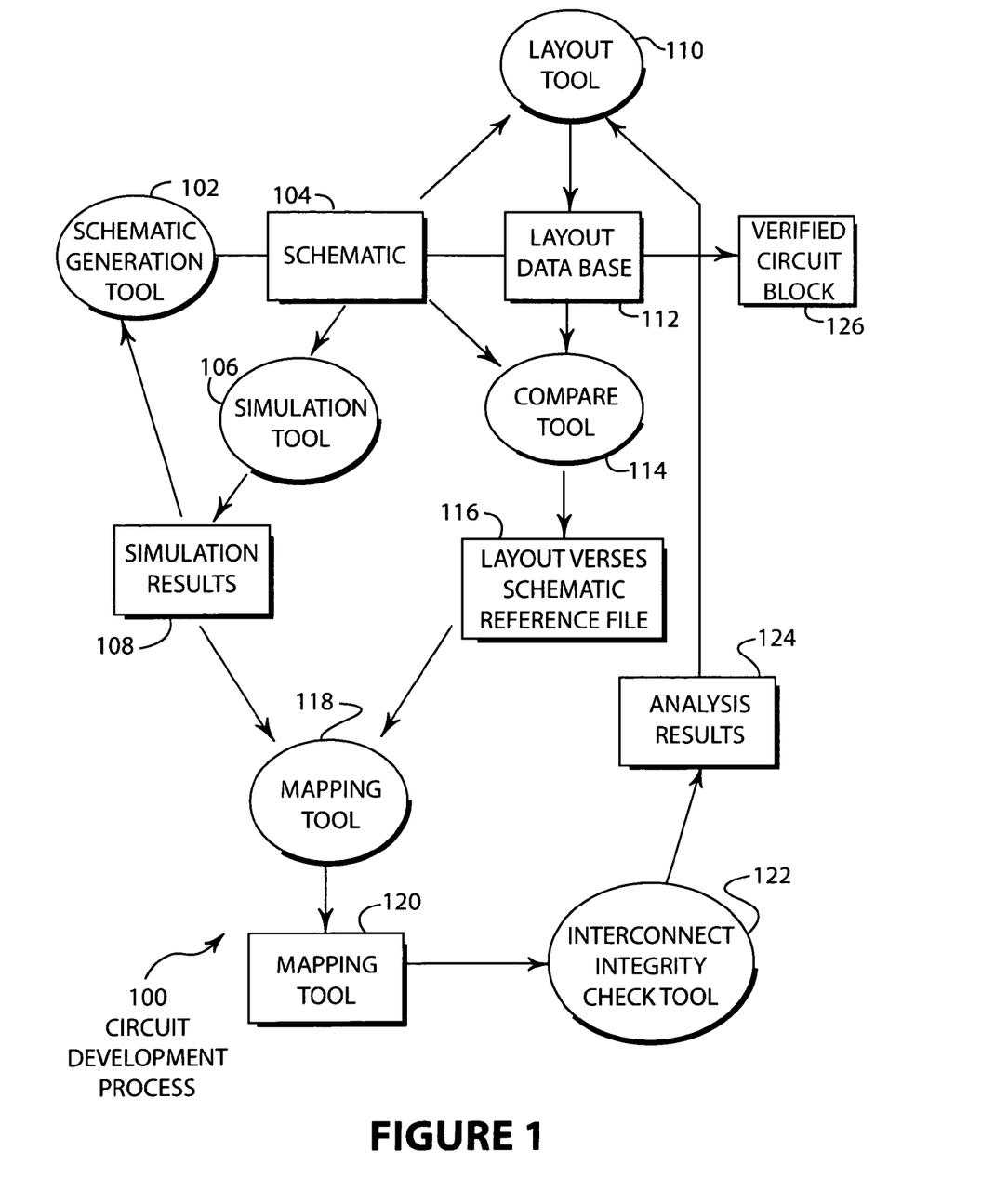
FIG. 1 is a diagrammatic illustration showing an embodiment of circuit development process.

FIG. 1 illustrates an embodiment 100 of the present invention showing a circuit development process. A circuit is first generated using a schematic generation tool 102, which produces a schematic 104. The schematic 104 is used by a simulation tool 106 to produce simulation results 108, which may be used within the schematic generation tool 102 to change or improve the circuit. The schematic 104 may also be used by a layout tool 110 to create the physical embodiment of the circuit in the layout database 112. A comparison tool 114 may compare the layout database 112 and the schematic 104 to produce a layout verses schematic reference file 116. The reference file 116 and the simulation results 108 may be used by a mapping tool 118 to produce a mapping file 120. The mapping file 120 may be analyzed using the interconnect integrity check tool 122 to produce analysis results 124, which may be used to improve or tweak the physical layout using the layout tool 110. When the circuit has passed all of the various checks, it may be saved as a verified circuit block 126.

The embodiment 100 illustrates a process and the tools by which circuits may be designed and implemented. The process is adaptable to circuits embodied on printed circuit boards using discrete components as well as circuits embodied in integrated circuits. Other embodiments of electronic circuits may also be developed using the process and tools of embodiment 100.

In the process of embodiment 100, various portions of the embodiment are shown as 'tools.' These may be separate and distinct software analysis routines or may be combined into one or more stand alone applications. For example in some embodiments, the mapping tool 118 and interconnect integrity check tool 122 may be combined as one software tool, while in other embodiments the schematic generation tool 102 and the simulation tool 106 may be combined.

The schematic generation tool 102 may be any type of schematic capture tool or circuit design tool. The schematic generation tool 102 may allow a designer to create a circuit by defining the various electrical components and the interconnections between those components. Many commercially available schematic capture tools are suited for operating as the schematic generation tool 102.

The simulation tool 106 may be any type of analysis routine for simulating the performance of the circuit. A commonly known tool is SPICE, but any tool that simulates the circuit and provides performance output can be used for the simulation tool 106. The simulation tool 106 may be especially suited for a particular type of circuit. For example, simulation tools 106 may be suited for digital circuit simulation, analog circuit simulation, radio frequency circuits, or any other special form of electrical circuits.

The simulation results 108 may take many forms. One useful form may include simulation results for each node or connection point of the circuit. The results may include the voltage and current at each node, or may include other performance characteristics, such as frequency, AC or DC voltage, power, or any other useful performance measurement. In some instances, the voltage and current may be the maximum values of the node during some period of the simulation run. In some cases, a simulation may exercise the circuit in several different states or with several different input conditions. In such cases, the simulation results 108 may include the maximum values of the aggregate of all the simulation results. In some cases, the results file 108 may be in the form of a net list.

The layout tool 110 may be used to create physical representations of the circuit, such as wiring connections, traces on a printed circuit board, or connections within an integrated circuit. Many embodiments may have layout tools that are specialized for a particular application, such as printed circuit board layout or integrated circuit layout.

The layout data base 112 may contain information regarding the physical representation of the circuit. For example, a connection in an integrated circuit may be defined by a trace width and one or more via connections between various layers of the integrated circuit. A connection in a printed circuit board may be similarly defined. A via is a connection between two or more layers of an integrated circuit or printed circuit board.

The compare tool 114 may compare the schematic 104 in the form of a net list with the actual physical representation of the circuit in the layout data base 112. The compare tool 114 may ensure that the connections in the physical design are the same as in the schematic 104. If there are discrepancies between the schematic 104 and the layout 112, the layout may be changed to correct any problems.

The mapping tool 118 maps or correlates the simulation results 108 to the layout reference file 116. The mapping file 120 includes the performance characteristics with physical elements of the circuit. For example, for a specific trace with a printed circuit board or an integrated circuit, the current and voltage may be stored. Similarly, each via or connection between traces may have an associated power level, frequency, or other characteristic. The specific physical elements defined in the mapping file 120 may vary for different applications. Similarly, the specific performance characteristics of a physical element may be different for specific applications.

The interconnect integrity check tool 122 may perform several different analyses on the mapping file 120. In a first pass, the interconnect integrity check tool 122 may evaluate the physical design against a set of minimum manufacturing or design criteria. For example, a certain manufacturing process or design criteria may specify a minimum trace width or that a certain minimum number or specific minimum size of vias be used between traces. Certain connections may have a minimum or maximum size based on manufacturing capabilities or as design standards. The specific criteria used for the minimum standards evaluation varies with the specific application and design and manufacturing practices anticipated for the circuit.

Another analysis that may be performed by the interconnect integrity check tool 122 may involve analyzing the performance characteristics of the circuit with respect to the physical embodiments. For example, while a trace may be larger than the recommended minimum for manufacturing purposes, the width may not be large enough to carry the maximum current determined by the simulation. In a specific embodiment, the current carrying capability of a trace may be a function of the width of the trace. The interconnect integrity check tool 122 may evaluate such a relationship to ensure that the trace width is sufficient. In another example, the tool 122 may evaluate the number of vias connecting two traces to determine that the number of vias is sufficient to carry the maximum current of the connection.

The analysis performed by the tool 122 may be any type of analysis that is relevant to the specific embodiment. In an example of an RF circuit, the power level or frequency characteristics of a signal may be compared to the physical geometry of a signal carrying trace. In another example of an analog circuit, the separation between two traces may be compared to the maximum voltage potential of the traces. Each application may have specific criteria that are identified as critical to the manufacturing or design performance of the circuit. Such criteria may be used by the tool 122 to verify that the circuit will perform as designed.

The analysis results 124 may be used to improve or tweak the physical layout of the circuit in the layout tool 110. For example, if the analysis results 124 indicates that a trace is too narrow, the layout tool 110 may be used to enlarge the trace.

By analyzing the simulation results 108 with certain physical layout characteristics of a circuit design, problems with the circuit can be avoided before manufacturing. Due to the tremendous complexity of some integrated circuit designs that may incorporate tens or hundreds of millions of transistors and billions of connections, identifying and isolating problems that may crop up only after the circuit is manufactured may be very time consuming and expensive.

Further, the simulation results 108 may be created by simulation tools 106 that are specifically tailored to the circuit. In some embodiments, a simulation tool for digital circuits may be used for developing a block of digital circuits, while an analog simulation tool may be used for a block of analog circuits. The two tested and simulated circuits may then be joined without having to simulate the entire joined circuit.

The verified circuit block 126 may represent a small portion of a much larger circuit design. In some embodiments, the verified circuit block 126 may be reused by different designs. For example, a verified circuit block 126 for a memory circuit may be developed using the embodiment 100 and used in multiple larger designs without having to redesign, re-layout, or re-simulate the circuit block.

The embodiment 100 enables pieces of a very large circuit to be developed using a 'bottom-up' approach to simulation and testing. Each segment of a circuit may be designed, rigorously simulated using the most appropriate simulation tool, laid out, and have the layout checked against the simulation results. So long as the inputs to the simulation were appropriate and the analysis of the interconnect integrity check tool was appropriate, the circuit segment may be ready for production.

Another advantage to the embodiment 100 is that the circuit blocks may be small enough to be easily managed. For example, a single engineer or a team of three or four engineers and designers may be assigned to design a specific circuit block. The design may be thoroughly simulated, laid out, and verified using embodiment 100 within the small design team and emerge with good confidence that the circuit will work properly.

One more advantage to the embodiment 100 is that the design rules and manufacturing knowledge of a company or industry may be embodied in the rules and formulas of the interconnect integrity check tool 122. For example, experimental testing of trace width current capacities may be translated into rules of thumb or other types of criteria that can be used in the tool 122. These design rules may be the result of costly mistakes or careful testing, and may also embody the corporate knowledge of a long history of circuit design.

Figure 2:
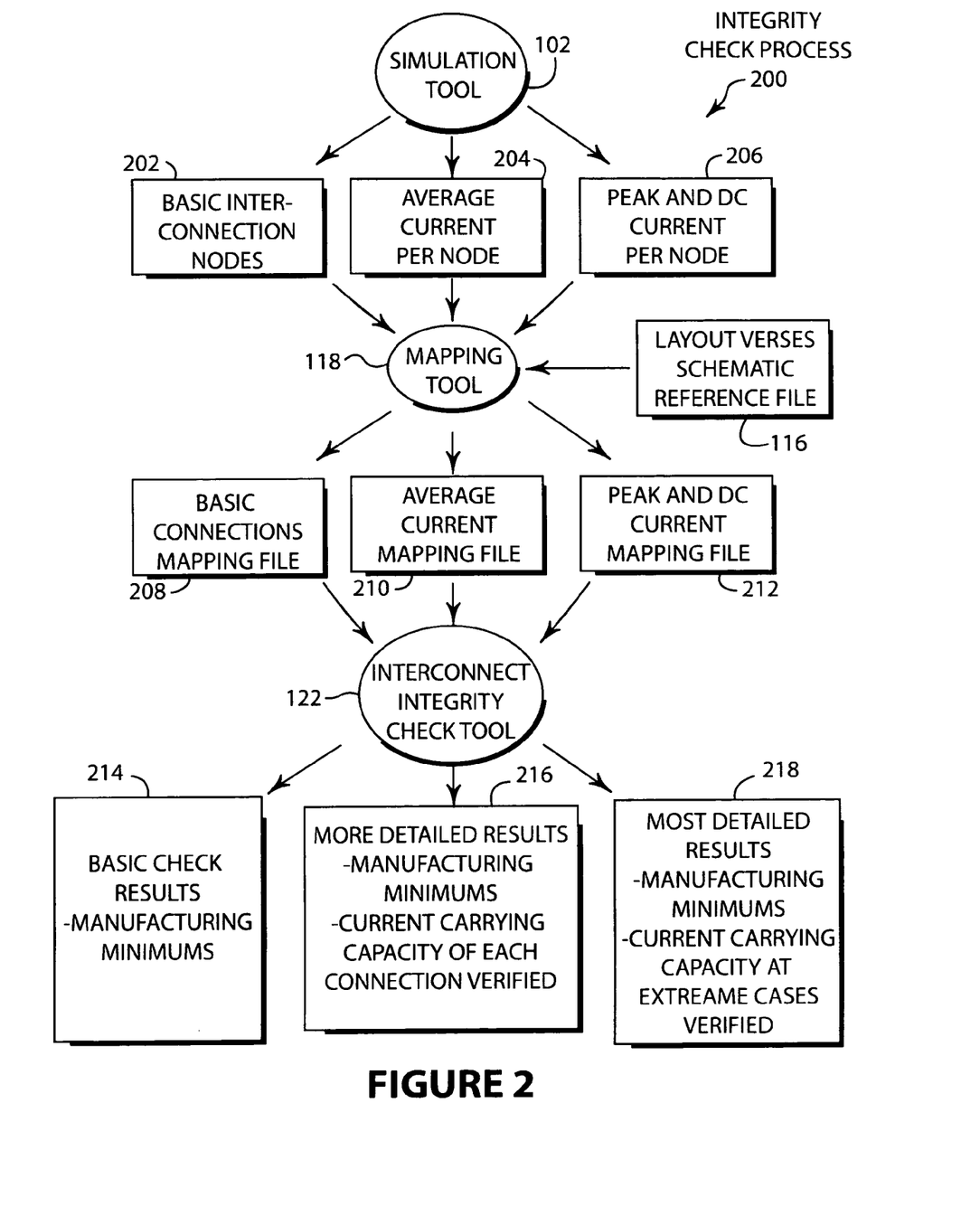
FIG. 2 is a diagrammatic illustration showing an embodiment of an integrity check process.

FIG. 2 illustrates an embodiment 200 showing the integrity check process. The simulation tool 102 may produce different types of simulation results: basic interconnection nodes 202, an average current per node 204, or a peak and DC current per node 206. When the mapping tool 118 processes the layout verses schematic reference file 116 with one of the simulation results 202, 204, and 206, different mapping files may emerge: basic connections mapping file 208, average current mapping file 210, and peak and DC current mapping file 212. Based on the mapping files, the interconnect integrity check tool 122 may produce various output files: a basic check results file 214, a more detailed results file 216, and a most detailed results file 218.

In a first pass of the design, the basic interconnection simulation result 202 may be useful for verifying the physical layout of the circuit. The results file 214 may include merely the results of a manufacturing or design minimum analysis. In such a result, a basic analysis of the manufacturability of the circuit is performed. Such a result may be useful in the initial stages of a circuit design.

The results files 216 and 218 may illustrate the point that the level of useful results from the tool 122 may be affected by the thoroughness of the simulation results 204 and 206. In some cases, the simulation results for a particular circuit may be very thorough and have a high degree of confidence. Such analysis may be desired when a circuit is very unique, newly developed, or performs a critical function. In the case where the basic circuit design is well known, a lower rigor may be applied to the simulation.

The results files 216 and 218 both may include the manufacturing minimum analysis as well as the current capacity of each connection. The more rigorous simulation results of the peak and DC current simulation may be used to perform the current carrying capacity of the 218, while the average current may be used for the results 216. In such a manner, the appropriate level of simulation may be used for the particular block of circuitry.

Figure 3:
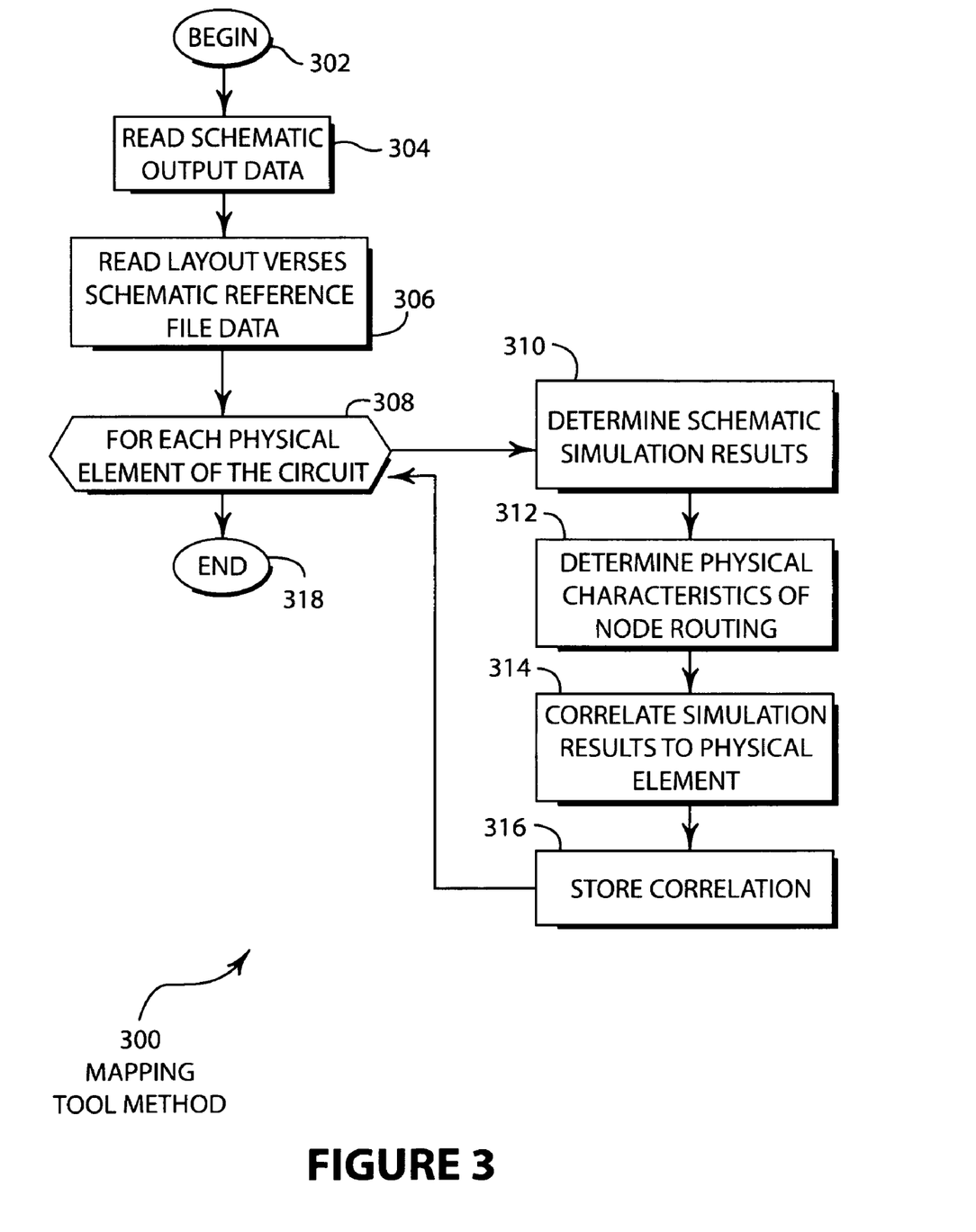
FIG. 3 is a flow chart illustration showing an embodiment of a mapping tool method.

FIG. 3 is a flowchart illustration of an embodiment 300 of a mapping tool operation. The process begins in block 302. Schematic output data is read in block 304 and the layout verses schematic reference data is read in block 306. For each physical connection of the circuit in block 308, the schematic simulation results are determined in block 310, the physical characteristics of the node routing are determined in block 312, and the simulation results are correlated to the physical element in block 314. The correlation is stored in block 316 and the process repeats in block 308. When all the connections are completed, the process ends in block 318.

Embodiment 300 is one manner for mapping the simulation results to the physical elements of the layout. The mapping method 300 takes the results from the layout tool in the form of the layout verses schematic reference file and correlates the simulation results so that the interconnect integrity tool may perform a verification. In other embodiments, the layout data may be in a different form other than the layout verses schematic reference file. The specific file configuration and format of the data may change with various embodiments.

In some cases, a single connection in the schematic may have several physical elements. For example, a connection between two transistors may be completed with several sets of vias and traces at different levels in an integrated circuit. In some instances, a connection between two elements may have ten or a hundred physical elements such as traces and vias.

The embodiment 300 may associate simulation data with various physical elements. In some cases, every physical element may have some associated simulation data while in other embodiments only certain physical elements may have associated simulation data. For example, one embodiment may associate simulation data with traces and vias, while another embodiment may associate simulation data with a subset of traces and exclude vias.

Figure 4:
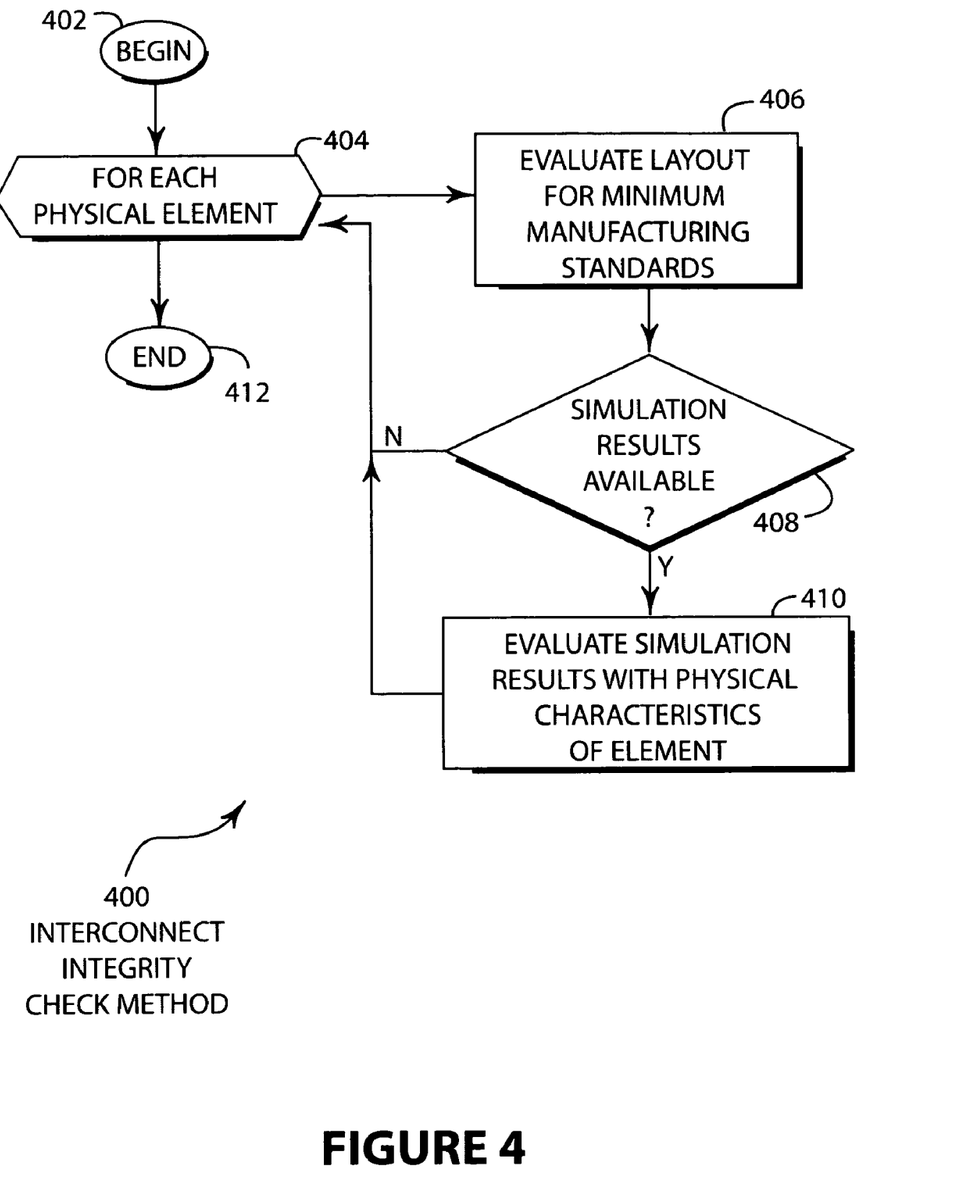
FIG. 4 is a flow chart illustration showing an embodiment of a interconnect integrity check method.

FIG. 4 is a flowchart illustration of an embodiment 400 showing an interconnect integrity check method. The process begins in block 402. For each physical element in block 404, the layout information is evaluated against the minimum manufacturing standards in block 406. If simulation results are available in block 408, the simulation results are evaluated with respect to the physical characteristics of the element in block 410. When each physical element is evaluated in block 404, the process ends in block 412.

The minimum manufacturing standards of block 406 may include various manufacturing or design guidelines that serve as the outer boundaries of acceptable design. For example, a minimum and maximum trace width may be a useful design guideline for printed circuit board or integrated circuit design. In another example, a design rule may include the minimum via size, number, or minimum spacing between vias.

The evaluation of simulation results in block 410 may include any type of useful evaluation of a characteristic of a physical element of the layout with simulation results. For example, the current carrying capacity of a trace as it is laid out may be compared to the simulated results to see if the trace is suitable.

Figure 5:
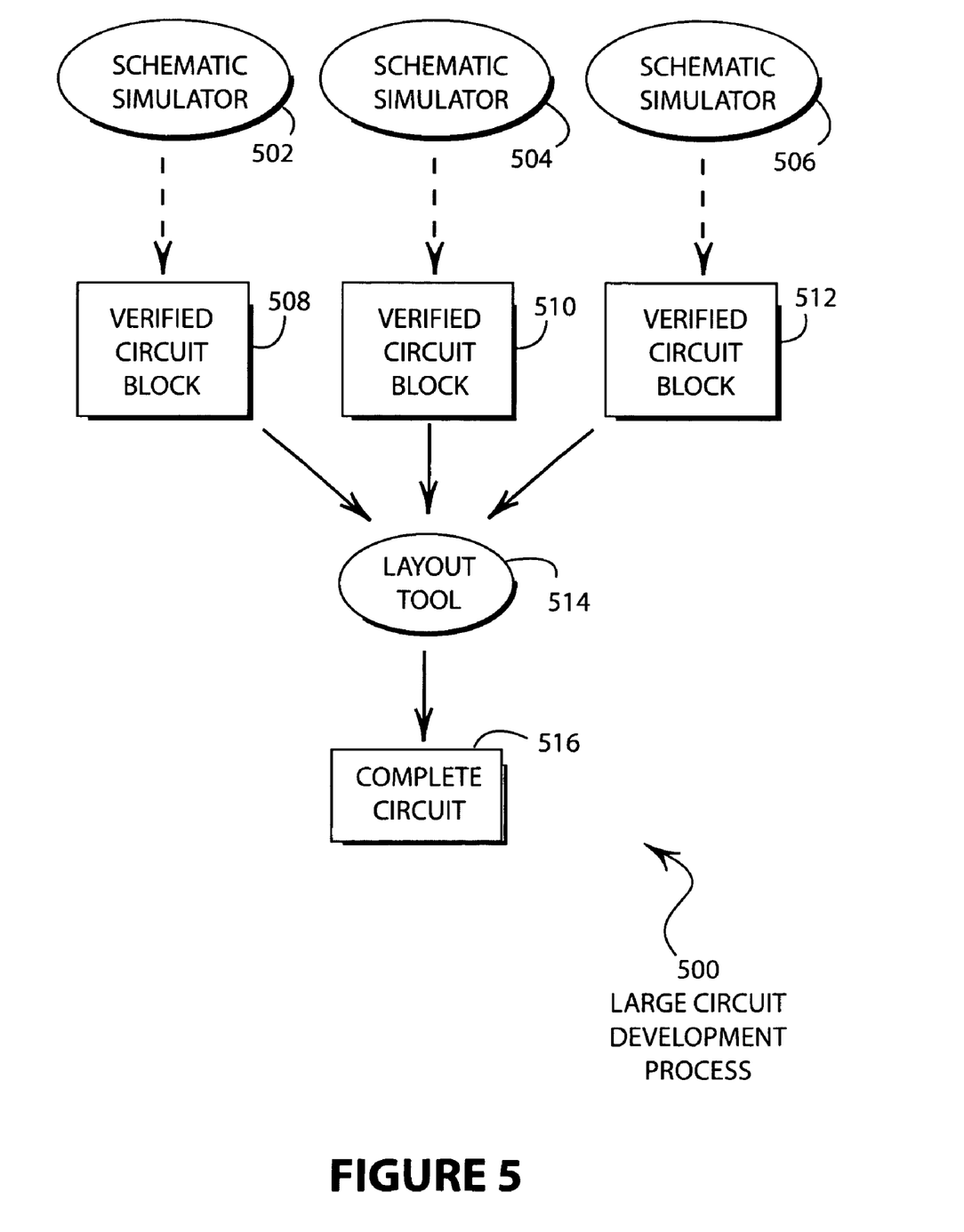
FIG. 5 is a diagrammatic illustration showing an embodiment of a development process for large circuits.

FIG. 5 is a diagrammatic illustration of an embodiment 500 of a large circuit development process. Three different schematic simulators 502, 504, and 506 are used to produce verified circuit blocks 508, 510, and 512. The circuit blocks are assembled using a layout tool 514 to produce a complete circuit 516.

Embodiment 500 illustrates how large circuit blocks may be developed using the process as illustrated in embodiment 100. Each verified circuit block 508, 510, and 512 may be developed separately and rigorously simulated. Because each block has been verified using the simulation results from the appropriate schematic simulator, the confidence in the circuit block should be relatively high. Thus, when the circuit blocks are joined together, the complete circuit 516 may also have a very high confidence in success.

In some embodiments, further simulation of the complete circuit 516 may not be necessary. In other embodiments, a separate simulation tool may be used to simulate the complete circuit 516 before releasing the design to production.

In some embodiments, the verified circuit blocks 508, 510, and 514 may be developed in parallel, while in other embodiments, the circuit blocks may be developed in serial. For example, in a tight design schedule, many separate design teams may develop and verify their circuit designs separately, and then combine the circuit blocks into a large completed circuit. In another embodiment, a circuit block may be designed and verified for one project and then used in its entirety in another project some time later. In yet another embodiment, verified circuit blocks may be created as part of a library that is used to develop large circuits for particular applications.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A system comprising:
   a schematic simulation tool capable of simulating a portion of a circuit and generating a simulator output file comprising at least one circuit performance value for at least one connection in said simulator output file;
   a layout tool for generating a physical representation of said portion of a circuit and further for generating a reference file comprising physical layout information for at least one element of said one connection;
   a mapping tool capable of generating a mapping file comprising said at least one circuit performance value with said physical layout information for said at least one element; and
   an analysis tool capable of evaluating said mapping file to determine that said physical layout information is sufficient based upon said at least one circuit performance value for said at least one element.

2. The system of claim 1 wherein said circuit comprises devices and traces in an integrated circuit package.

3. The system of claim 1 wherein said circuit comprises devices and traces a printed circuit board.

4. The system of claim 1 wherein said at least one circuit performance value comprises a current.

5. The system of claim 4 wherein said current is a maximum current.

6. The system of claim 4 wherein said current is an average current.

7. The system of claim 1 wherein said at least one circuit performance value comprises a voltage.

8. The system of claim 1 wherein said physical layout information comprises a trace width.

9. The system of claim 1 wherein said physical layout information comprises at least one via definition.

10. The system of claim 1 wherein said evaluating said mapping file comprises evaluating said physical layout information with predetermined design rules.

11. The system of claim 10 wherein said evaluating said mapping file further comprises evaluating said at least one circuit performance value and said physical layout information with said predetermined design rules.

12. A method comprising:
   generating a schematic output file using a schematic simulation tool, said schematic output file comprising at least one circuit performance value for at least one connection of a circuit;
   generating a physical layout for said circuit, said physical layout comprising at least one physical element describing said at least one connection;
   generating a reference file containing physical layout information for said at least one element;
   generating a mapping file comprising said physical layout information and said at least one circuit performance value for said at least one element; and
   evaluating said mapping file by comparing said at least one circuit performance value with said physical layout information with predetermined rules for said element.

13. The method of claim 12 wherein said circuit comprises devices and traces in an integrated circuit package.

14. The method of claim 12 wherein said circuit comprises devices and traces a printed circuit board.

15. The method of claim 12 wherein said at least one circuit performance value comprises a current.

16. The method of claim 15 wherein said current is a maximum current.

17. The method of claim 15 wherein said current is an average current.

18. The method of claim 12 wherein said at least one circuit performance value comprises a voltage.

19. The method of claim 12 wherein said physical layout information comprises a trace width.

20. The method of claim 12 wherein said physical layout information comprises at least one via definition.

21. The method of claim 12 wherein said evaluating said mapping file comprises evaluating said physical layout information with predetermined design rules.

22. The method of claim 21 wherein said evaluating said mapping file further comprises evaluating said at least one circuit performance value and said physical layout information with said predetermined design rules.

* * * * *